United States Patent [19]

Henderson

[11] 4,315,781

[45] Feb. 16, 1982

[54] METHOD OF CONTROLLING MOSFET THRESHOLD VOLTAGE WITH SELF-ALIGNED CHANNEL STOP

[75] Inventor: Richard C. Henderson, Westlake Village, Calif.

[73] Assignee: Hughes Aircraft Company, Culver City, Calif.

[21] Appl. No.: 142,902

[22] Filed: Apr. 23, 1980

[51] Int. Cl.³ .................. H01L 21/263; H01L 29/78; H01L 27/04
[52] U.S. Cl. .................................. 148/1.5; 148/187; 357/23; 357/52; 357/91
[58] Field of Search .................. 148/1.5, 187; 357/23, 357/52, 91

[56] References Cited

U.S. PATENT DOCUMENTS

| | | | |
|---|---|---|---|
| 3,728,161 | 4/1973 | Moline | 148/1.5 |
| 3,748,187 | 7/1973 | Aubuchon et al. | 148/1.5 |
| 3,873,372 | 3/1975 | Johnson | 148/1.5 |
| 3,891,468 | 6/1975 | Ito et al. | 148/1.5 |
| 3,898,105 | 8/1975 | Mai et al. | 148/1.5 |
| 3,899,363 | 8/1975 | Dennard et al. | 148/1.5 |
| 4,011,581 | 3/1977 | Kubo et al. | 357/52 |
| 4,021,835 | 5/1977 | Etoh et al. | 357/23 |
| 4,052,229 | 10/1977 | Pashley | 148/1.5 |
| 4,074,301 | 2/1978 | Paivinen et al. | 357/23 |
| 4,078,947 | 3/1978 | Johnson et al. | 148/1.5 |
| 4,080,718 | 3/1978 | Richman | 29/571 |
| 4,140,547 | 2/1979 | Shibata et al. | 148/1.5 |
| 4,144,101 | 3/1979 | Rideout | 148/1.5 |
| 4,217,149 | 8/1980 | Sawazaki | 148/1.5 |
| 4,218,267 | 8/1980 | Maddox, Jr. | 148/1.5 |

Primary Examiner—Upendra Roy
Attorney, Agent, or Firm—David W. Collins; W. H. MacAllister

[57] ABSTRACT

A process is provided for fabricating MOSFET devices having field source, gate and drain regions. The threshold voltage of both the channel and field regions of such devices is controlled by forming a comparatively thick oxide film on a semiconductor surface, defining enhancement mode transistor regions in the oxide film to expose portions of the semiconductor surface, implanting p-type ions under conditions such that the peak distribution of p-type atoms lies in the semi-conductor substrate just beneath the semiconductor/-oxide interface and counter-doping with n-type ions under conditions such that no implanted ions penetrate the oxide film. As a consequence, a desirably high threshold voltage is obtained in the field region, while a desirably low threshold voltage is obtained in the channel region. Depletion mode transistors are fabricated on the same wafer by masking the enhancement mode regions, defining depletion mode transistor regions in the oxide film to expose portions of the semiconductor surface and implanting n-type ions under conditions such that no ions penetrate the mask or oxide film. Metal gate or refractory gate technology is then employed to fabricate source, gate and drain regions and electrical contacts thereto. Parasitic conduction paths between neighboring transistors are substantially eliminated due to the peak distribution of p-type atoms in the field region.

12 Claims, 8 Drawing Figures

METHOD OF CONTROLLING MOSFET THRESHOLD VOLTAGE WITH SELF-ALIGNED CHANNEL STOP

The Government has rights in this invention pursuant to Contract No. N00173-77-C-0228 awarded by the Department of the Navy.

BACKGROUND OF THE INVENTION

1. Field of the Invention

The invention relates to a process for fabricating MOSFET devices on a single semiconductor substrate, and, more particularly, to a process for providing MOSFET devices with improved control over threshold voltage and reduced parasitic conduction paths between neighboring transistors.

2. Description of the Prior Art

Processes for fabricating MOSFET (metal oxide semiconductor field effect transistor) devices, including both enhancement mode and depletion mode transistors, are wellknown. With improvements in reduction of spacing between devices as a consequence of improved photolithographic technology, parasitic conduction paths between neighboring transistors becomes a problem. Several approaches have been devised to eliminate parasitic conduction paths between transistors by heavily doping the intervening surface (the field region). U.S. Pat. Nos. 3,873,372 (Johnson), 4,074,301 (Paivinen et al) and 4,078,947 (Johnson et al) all teach different methods of achieving this. The difficulties encountered are (1) obtaining a low boron concentration in the MOSFET channel and (2) minimizing the separation between the high and low doped regions at the channel edge. Paivinen teaches eliminating parasitic conduction paths by implanting the wafer surface and then etching away the implanted material in the channel, source and drain regions. Johnson teaches using a nitride mask over the channel region. Johnson et al teach that the field adjusting implant can be done through an oxide. However, the difficulty with the Johnson et al technique is that the channel becomes heavily doped. A further problem with the Paivinen and Johnson et al patents is that the threshold voltage for enhancement mode (normally off) transistors is determined by an implant of boron. Consequently, low threshold voltages, on the order of a few tenths of a volt, are difficult to set accurately.

SUMMARY OF THE INVENTION

In accordance with the invention, a process is provided for setting threshold voltage of enhancement mode MOSFET devices formed on a semiconductor substrate doped with atoms of a first conductivity type which includes forming source, drain and gate regions in at least one portion of the substrate and making electrical contact to the regions. The threshold voltage is set by adjusting the difference between two implantations of atoms of different conductivity type into the portion.

Further in accordance with the invention, a process for fabricating a plurality of MOSFET devices on a semiconductor substrate doped with atoms of a first conductivity type includes the following steps:

(a) forming a dielectric film on one surface of the semiconductor substrate;

(b) forming a plurality of first openings in the film to expose a plurality of first portions of the surface;

(c) implanting atoms of the same conductivity type as the first conductivity type, the implantation being done under conditions such that the peak distribution of implanted atoms lies in the semiconductor substrate just beneath the semiconductor/dielectric interface; and (d) implanting atoms of a second conductivity type opposite to the first conductivity type, the implantation being done under conditions such that essentially no implanted ions of this type penetrate the dielectric film. The semiconductor substrate is then processed in accordance with well-known prior art methods by either metal gate or refractory gate technology to form completed devices.

The foregoing process sets forth the formation of enhancement mode transistors. Depletion mode transistors are fabricated on the same substrate by a process following step (d) which further includes the following steps:

(e) forming a removable, protective layer over the plurality of first openings;

(f) forming a plurality of second openings in both the dielectric film and the protective layer to expose a plurality of second portions of the surface; and (g) implanting atoms of a second conductivity type opposite to the first conductivity type, the implantation being done under conditions such that essentially no implanted ions penetrate through the dielectric film or protective layer.

The process of the invention provides an enhancement mode device having a field region that is highly doped with atoms of the first conductivity type and a channel region that is lightly doped with atoms of the second conductivity type. The net doping of the channel region, however, remains that of the first conductivity type, though at a lower concentration. The doping is such that the distribution of atoms of the first conductivity type is established well into the substrate in the channel region of the enhancement mode device, but just within the semiconductor substrate near the semiconductor/dielectric interface in the field region. The distribution of atoms of the second conductivity type is somewhat shallower in the channel region of the enhancement mode device and essentially non-existent in the field region. The channel region of the depletion mode device is lightly doped with atoms of the second conductivity type.

In contrast to the prior art of determining the threshold voltage of the enhancement mode transistors by implantation of the first conductivity type implant, the present invention sets the threshold of enhancement mode transistors by the second conductivity type implant in combination with the first conductivity type implant. Thus, the threshold voltage is controlled by a mixture of both types; the second implantation provides a greater range of control over the threshold voltage than possible with prior art devices. For example, a threshold voltage of $0.3 \pm 0.1$ V is easily attained.

As the consequence of the high doping of the field region, a large voltage is required to generate even small amounts of parasitic leakage current between neighboring transistors.

DETAILED DESCRIPTION OF THE INVENTION

Figure 1A:
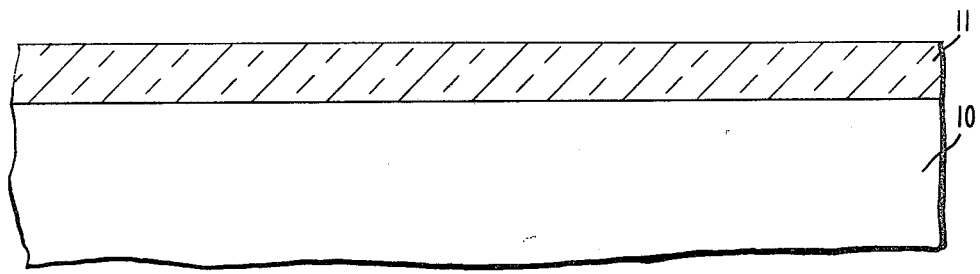
FIGS. 1a-d are cross-sectional views of a portion of a semiconductor substrate processed in accordance with the invention.

Referring now to the Drawing, FIG. 1a depicts a semiconductor substrate 10, preferably silicon, here lightly doped with p-type atoms, about $10^{15}$ atoms/cm$^3$, over which has been formed a dielectric film 11. Preferably, film 11 is silicon dioxide, often referred to as the field oxide, and, in this process, is formed to a thickness of about 4,000 to 5,000 Å. While the silicon substrate shown here is doped with a p-type material, on which n-MOS devices will be fabricated, it should be understood that n-type silicon may also be employed as a substrate for fabricating p-MOS devices. The corresponding changes in the process set forth below would then be made.

Figure 1B:
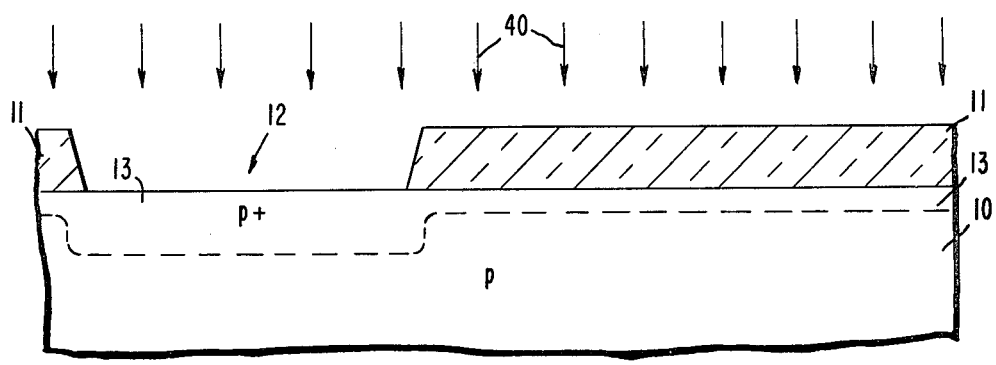

For fabricating enhancement mode devices, a plurality of openings, one of which is shown at 12 in FIG. 1b, is formed in film 11 by conventional masking and etching techniques. These openings define the region that will subsequently become the source, drain and channel regions of the enhancement mode devices. P-type atoms, such as boron, are then implanted, shown at 40, to form a p+ region 13 in the semiconductor substrate. The implantation is done under conditions such that the peak distribution of atoms lies in the silicon substrate just beneath the silicon/silicon oxide interface (i.e., within a few hundred Å thereof) in order to overcome processing variations in oxide formation. This ensures that the p-doping concentration is maximum near the surface, which, in combination with the n-doping described below, establishes control over threshold voltage of the enhancement mode devices. The position of the distribution peak near the interface also serves to reduce parasitic conduction between neighboring transistors.

Simple experimentation is adequate for determining the particular conditions needed to establish the desired doping profile. For example, for a film of silicon dioxide 4,000 Å thick, a boron implant at a dosage of $1 \times 10^{13}$/cm$^2$ at 120 keV is sufficient to form the desired doping profile, and results in a boron concentration in field region 13 of about $10^{17}$/cm$^3$. In the channel region of the enhancement mode device, the peak distribution of implanted atoms is about 0.4 μm below the silicon surface.

Figure 1C:
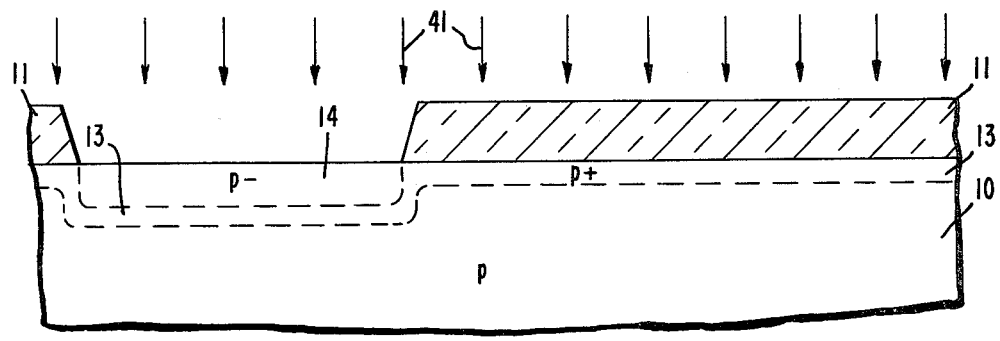

A second implantation, shown at 41, is then done, as depicted in FIG. 1c, employing atoms of opposite conductivity to the first implantation. For a first implantation of p-type atoms, the second implantation is of n-type atoms, such as phosphorus or arsenic. The implantation is done under conditions such that essentially no implanted ions penetrate the dielectric film 11. Again, simple experimentation is adequate for determining the particular conditions. For example, for a silicon dioxide film 4,000 Å thick, a phosphorus implantation at a dosage of $4 \times 10^{12}$/cm$^2$ at 200 keV is sufficient to meet the foregoing conditions. This second implantation, which is shallower in the channel region of the enhancement mode device than the first implantation, serves to counter-dope a portion 14 of the first implantation, although the net doping remains that of the first conductivity type. As a consequence of the comparative net light doping, region 14 is depicted here as p−.

Figure 1D:
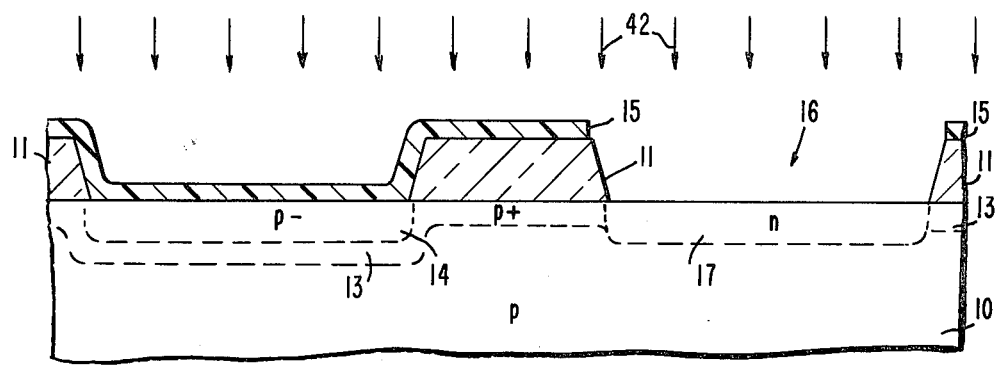

For depletion mode transistors, the substrate is further processed by forming thereon a photoresist or other easily removable, protective layer 15, typically about 1 μm in thickness, and etching portions of the photoresist layer and dielectric film to form a plurality of second openings, one of which is shown at 16 in FIG. 1d. These openings define regions that will subsequently become the source, drain and channel regions of the depletion mode devices. A third implantation of ions, shown at 42 and opposite in conductivity to the first implantation, is carried out to form region 17 in the substrate, here shown as n-type conductivity, which dominates the existing p-type conductivity in that region. The implantation is done under conditions, easily determined experimentally, such that essentially no implanted ions penetrate the dielectric film 11 or mask 15. Consequently, the channel region is lightly doped with atoms of the second conductivity type. Employing the conditions described above for phosphorus implantation, a concentration of phosphorus on the order of $10^{17}$/cm$^3$ is obtained for region 17.

Figure 2:
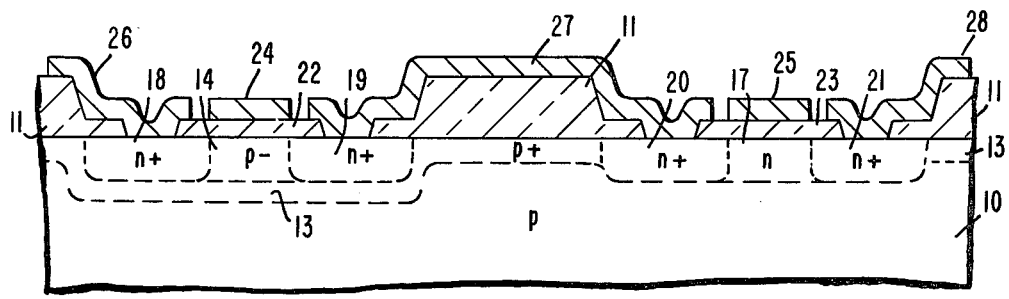
FIG. 2 is a cross-sectional view of a portion of semiconductor substrate including both an enhancement mode transistor (left side) and a depletion mode transistor (right side), produced by conventional metal gate technology and employing the inventive process.

The substrate is then further processed in accordance with prior art techniques for fabricating finished devices. For example, metal gate (aluminum) devices are formed by diffusing source and drain regions, here n+, growing a gate oxide, employing photoresist for masking and etching contact holes, metallizing the entire surface of the semiconductor and employing photoresist to form the final metal electrode pattern. FIG. 2, in cross section, shows source 18 and drain 19 regions, with gate 24 over region 14. Electrode 26 contacts the source region, while electrode 27 contacts the drain region. Electrode 27 which also contacts source region 20 of the depletion mode transistor. Gate oxide 22 of the enhancement mode device separates gate 24 from the semiconductor surface. In the depletion mode device, gate oxide 23 separates gate 25, which is positioned over region 17, from the semiconductor surface. Electrode 28 contacts drain region 21.

Figure 3:
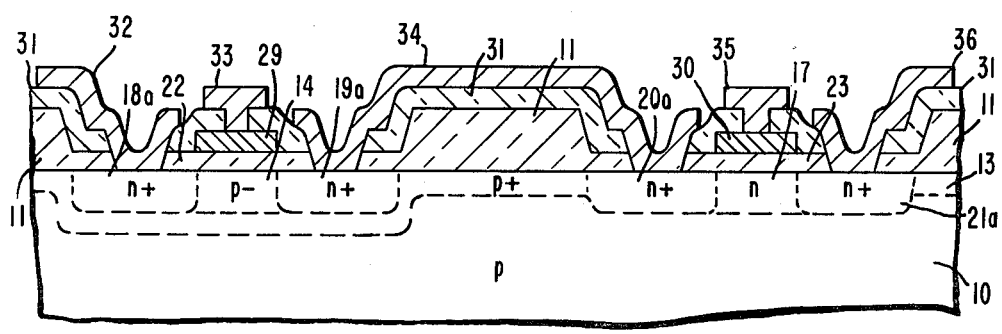
FIG. 3 is a cross-sectional view of a portion of a semiconductor substrate including both an enhancement mode transistor (left side) and a depletion mode (right side) transistor formed by conventional refractory gate technology and employing the inventive process.

FIG. 3, in cross section, depicts the results of the refractory gate process. Gate oxide 22, 23 is grown over enhancement mode and depletion mode regions, respectively. The refractory gate metal 29, 30, such as polycrystalline silicon highly doped to n++ (about 15Ω/□, is deposited and etched to form the respective gates. Formation of source 18a, 20a and drain 19a, 21a regions is accomplished by either etching through the thin oxide layer and diffusing in the appropriate impurity or by implanting through the thin oxide. In either case, the gate acts to self-align the channel 14, 17. For tighter control, however, the self-aligned implant process is preferred. Oxide layer 31 is then formed over the surface of the wafer and holes are formed for source, drain and gate contacts. Metal is then evaporated over the surface and etched to form source electrode 32, gate electrode 33, drain electrode and source electrode 34, gate electrode 35 and drain electrode 36.

Channel threshold voltage of the enhancement device is set by the energy of the n-type dopant (e.g., phosphorus) implantation and dosage in that portion of the process related to FIG. 1c, above. The phosphorus implantation controls the voltage needed on the gate, and permits setting threshold voltages to as low as a few hundred millivolts. Consequently, faster devices are obtained, requiring lower power. The phosphorus implantation also permits reduction of gate length to less than 1 μm for higher packing density of devices. At such smaller dimensions, a considerably higher concentration of p-type dopant (e.g., boron) at the gate would be required to avoid punch-through.

The usefulness of phosphorus implantation is shown by the following consideration. Without phosphorus implantation, the channel threshold would be greater than one volt; with high phosphorus implantation, a threshold voltage of about 0 volts is approached. Employing phosphorus implantation at the moderate levels disclosed herein permits attaining a threshold voltage of about 0.3 volts, which allows a variation in process parameters resulting in a ±0.1 volt deviation and still have an enhancement mode device.

Other benefits of the process described herein include the following:

(a) The p+ field implant (region 13) is uniform; there is little lateral diffusion as with earlier techniques involving selective doping of the field region. This is due to implantation of boron following formation of the field oxide. Consequently, the process described here is superior for fabricating narrow channel devices.

(b) Alignment between the channel region (regions 14, 17) and the highly doped field region (region 13) is obtained. This is important in defining device parameters.

(c) The double implant process of the invention appears to reduce short and narrow channel effects on threshold voltage. Usually, in prior art devices, $V_T$ is observed to decrease as the channels get short and increase as the channels get narrow. Devices fabricated in accordance with the invention do not evidence such behavior to as great an extent.

EXAMPLES

EXAMPLE 1

A device having substantially the same configurations as that depicted in FIG. 2 was fabricated. The thickness of the field oxide 11 was 4,000 Å, while that of the gate oxide 22, 23 was about 400 Å. Boron was implanted at a dosage of $1 \times 10^{13}/cm^2$ at 120 keV. The first phosphorus implantation (enhancement mode device) was performed at a dosage of $3 \times 10^{12}/cm^2$ at 200 keV; the second phosphorus implantation (depletion mode device) was performed at a dosage of $6 \times 10^{12}/cm^2$ at 80 to 150 keV.

The channel threshold voltage of the enhancement mode device was 0.3 V. Less than 1 μA of current flowed across the parasitic transistor at 16 V, thus providing a desirable ratio of channel threshold voltage to parasitic voltage.

EXAMPLE 2

Devices were fabricated substantially as in Example 1, employing the gate oxide thicknesses ($T_{ox}$) and boron and phosphorus implantation dosages and energies listed in the Table below. The resulting threshold voltage ($V_T$) is indicated. The variation in threshold voltage as a function of phosphorus implant conditions is evident.

| | Boron Implant | | Phosphorus Implant | | |
|---|---|---|---|---|---|
| $T_{ox}$, Å | Dose, cm$^{-2}$ | Energy, keV | Dose, cm$^{-2}$ | Energy, keV | $V_T$ |
| 250 | $1 \times 10^{13}$ | 120 | $3 \times 10^{12}$ | 200 | 0.0 |
| 576 | $1 \times 10^{13}$ | 120 | $3 \times 10^{12}$ | 200 | +1.0 |
| 1350 | $1 \times 10^{13}$ | 120 | $3 \times 10^{12}$ | 200 | +3.0 |
| 400 | $1 \times 10^{13}$ | 120 | $4 \times 10^{12}$ | 200 | −0.3 |
| 430 | $1 \times 10^{13}$ | 120 | $8 \times 10^{12}$ | 150 | −2.0 |
| 430 | $5 \times 10^{12}$ | 120 | $4 \times 10^{12}$ | 150 | −1.4 |
| 430 | $2.5 \times 10^{13}$ | 120 | $2 \times 10^{13}$ | 150 | −3.6 |

EXAMPLE 3

Figure 4:
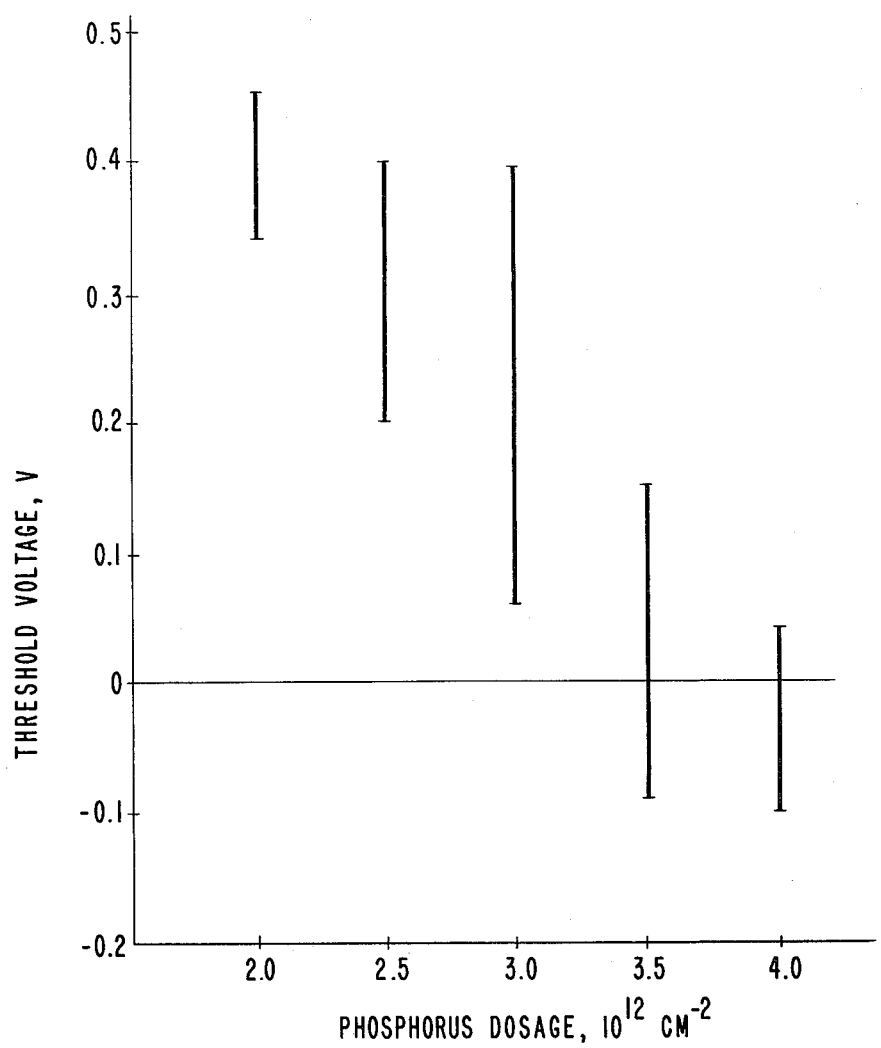
FIG. 4, on coordinates of phosphorus implant dosage and threshold voltage, depicts the electrical behavior of enhancement mode devices fabricated in accordance with the invention.
Figure 5:
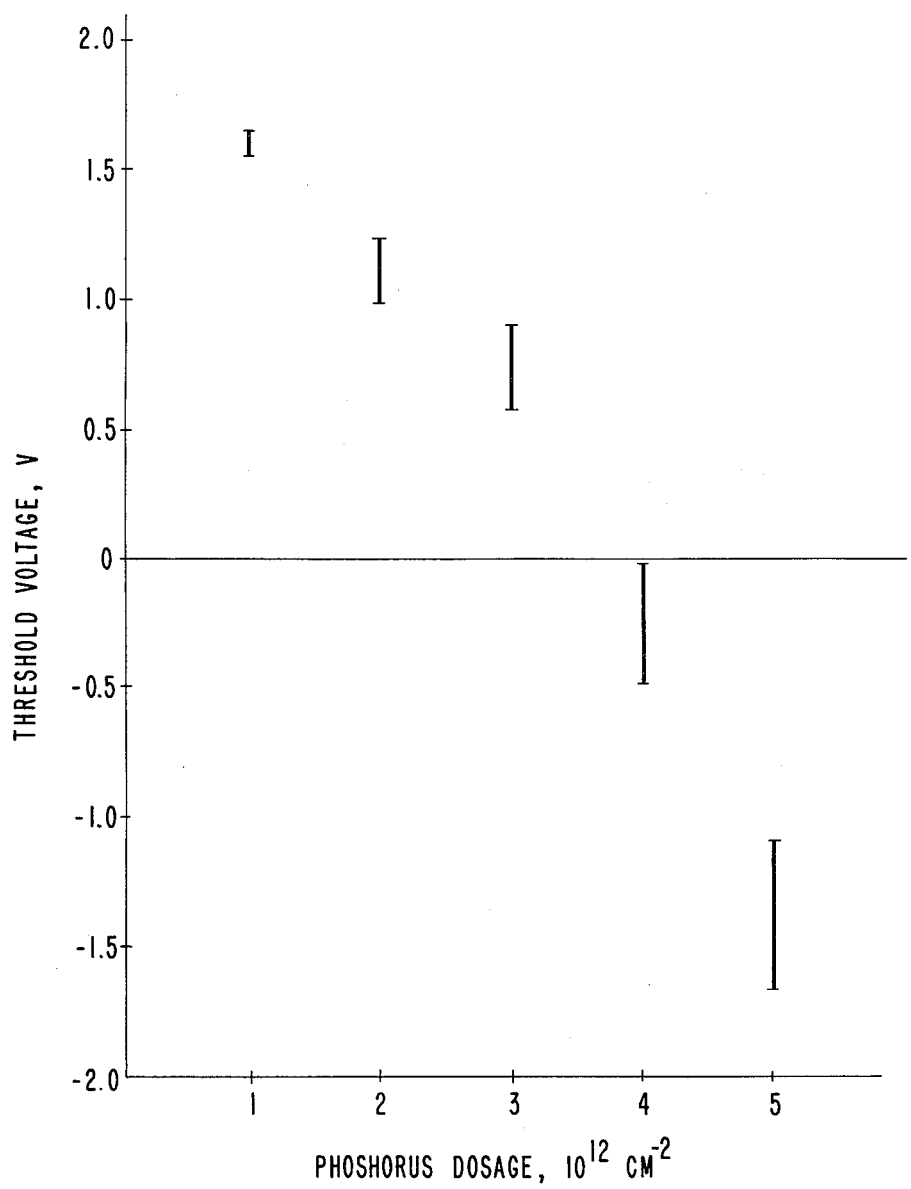
FIG. 5, on coordinates of phosphorus implant dosage and threshold voltage, depicts the electrical behavior of depletion mode devices fabricated in accordance with the invention.

Devices were fabricated substantially as in Example 1, employing a gate oxide thickness of about 360 Å, with boron implantations at dosages of $1 \times 10^{13}/cm^2$ at 120 keV. Phosphorus implantations for enhancement mode devices were performed at various dosages at 200 keV, while phosphorus implantations for depletion mode devices were performed at various dosages at 80 keV. The results are depicted in FIG. 4 (enhancement mode devices) and FIG. 5 (depletion mode devices), which are plots of resulting threshold voltage as a function of phosphorus implantation dosage. The statistical variations of observed device characteristics are plotted; these resulted from fluctuations in implant dose, thermal processing, oxide variations and the like. Nevertheless, the variation in threshold voltage as function of phosphorus implant conditions is evident. For enhancement mode devices, a phosphorus dosage of about $2.5 \times 10^{12}$ at 200 keV resulted in a threshold voltage of 0.3±0.1 V. For depletion mode devices, a desirable threshold voltage in the range of about −1 to −2 V was attained.

What is claimed is:

1. A method of setting threshold voltage of enhancement mode MOSFET devices formed on a semiconductor substrate doped with atoms of a first conductivity type which includes forming source, drain and gate regions in at least one portion of said substrate and making electrical connections to said regions, wherein the improvement comprises setting threshold voltage prior to forming said regions by adjusting the difference between two implantations of atoms of different conductivity type into said at least one portion by a process which comprises:

(a) forming a dielectric film covering portions of a surface of said substrate, which forms a semiconductor/dielectric interface, the exposed portions comprising said regions to be formed;

(b) implanting into said substrate atoms of the same conductivity type as said first conductivity type under conditions such that said atoms evidence a peak distribution in said substrate just beneath said semiconductor/dielectric interface; and (c) implanting into said substrate atoms of a second conductivity type under conditions such that essentially no atoms of said second conductivity type penetrate said dielectric film.

2. The method of claim 1 which comprises forming n-channel enhancement mode devices on a p-doped silicon substrate having a field oxide film covering portions of a surface of said substrate, which forms a silicon/oxide interface, implanting p-type atoms into the substrate under conditions such that said p-type atoms evidence a peak distribution in said substrate just beneath said silicon/oxide interface and implanting n-type atoms under conditions such that essentially no n-type atoms penetrate said oxide film.

3. The method of claim 2 in which said p-type atoms consist essentially of boron and said n-type atoms consist essentially of an element selected from the group consisting of phosphorus and arsenic.

4. A process for fabricating a plurality of MOSFET devices on a semiconductor substrate doped with atoms of a first conductivity type which includes forming source, drain and gate regions in said substrate and making electrical contact thereto, wherein the improvement includes treating said semiconductor substrate prior to forming said regions as follows:
  (a) forming a dielectric film on one surface of said semiconductor substrate to form a semiconductor/dielectric interface;
  (b) forming a plurality of first openings in said film to expose a plurality of first portions of said surface;
  (c) implanting atoms of the same conductivity type as said first conductivity type, said implantation being done under conditions such that said atoms evidence a peak distribution in said semiconductor substrate just beneath said semiconductor/dielectric interface; and
  (d) implanting atoms of a second conductivity type opposite to said first conductivity type, said implantation being done under conditions that essentially no implanted ions penetrate said dielectric film.

5. The process of claim 4 further including
  (e) forming a removable, protective layer over said plurality of first openings;
  (f) forming a plurality of second openings in said film and said layer to expose a plurality of second portions of said surface; and
  (g) implanting atoms of a second conductivity type opposite to said first conductivity type, said implantation being done under conditions that essentially no implanted ions penetrate said dielectric film or protective layer.

6. The process of claim 4 or 5 in which said semiconductor substrate consists essentially of silicon and said dielectric film consists essentially of silicon dioxide.

7. The process of claim 6 in which said first conductivity type is p-type and said second conductivity type is n-type.

8. The process of claim 7 in which said first conductivity type implanting atoms consist essentially of boron and said second conductivity type implanting atoms consist essentially of an element selected from the group consisting of phosphorus and arsenic.

9. A process for fabricating a plurality of enhancement mode and depletion mode MOSFET devices on a semiconductor substrate doped with atoms of a first conductivity type which includes forming source, drain and gate regions in said substrate and making electrical contact thereto, wherein the improvement includes treating said semiconductor substrate prior to forming said regions as follows:
  (a) forming a dielectric film on one surface of said semiconductor substrate to form a semiconductor/dielectric interface;
  (b) forming a plurality of first openings in said film to expose a plurality of first portions of said surface;
  (c) implanting atoms of the same conductivity type as said first conductivity type, said implantation being done under conditions such that said atoms evidence a peak distribution in said semiconductor substrate just beneath said semiconductor/dielectric interface;
  (d) implanting atoms of a second conductivity type opposite to said first conductivity type, said implantation being done under conditions such that essentaily no implanted ions penetrate said dielectric film;
  (e) forming a removable, protective layer over said plurality of first openings;
  (f) forming a plurality of second openings in said film and said layer to expose a plurality of second portions of said surface; and
  (g) implanting atoms of a second conductivity type opposite to said first conductivity type, said implantation being done under conditions that essentially no implanted ions penetrate said dielectric film or protective layer.

10. The process of claim 9 in which said semiconductor substrate consists essentially of silicon and said dielectric film consists essentially of silicon dioxide.

11. The process of claim 10 in which said first conductivity type is p-type and said second conductivity type is n-type.

12. The process of claim 11 in which said first conductivity type implanting atoms consist essentially of boron and said second conductivity type implanting atoms consist essentially of an element selected from the group consisting of phosphorus and arsenic.

* * * * *